United States Patent [19]

Choi

[11] Patent Number: 5,452,253
[45] Date of Patent: Sep. 19, 1995

[54] BURN-IN TEST CIRCUIT FOR SEMICONDUCTOR MEMORY DEVICE

[75] Inventor: Young-Keun Choi, Kyunggi-do, Rep. of Korea

[73] Assignee: Goldstar Electron, Co. Ltd., Cheongju, Rep. of Korea

[21] Appl. No.: 125,574

[22] Filed: Sep. 23, 1993

[30] Foreign Application Priority Data

Sep. 24, 1992 [KR] Rep. of Korea ............ 92-18222

[51] Int. Cl.$^6$ ............................................. G11C 29/00
[52] U.S. Cl. .......................... 365/201; 365/189.09; 365/193
[58] Field of Search .............. 365/201, 191, 189.09, 365/205, 189.07, 193; 371/21.1

[56] References Cited

U.S. PATENT DOCUMENTS

| | | | |
|---|---|---|---|
| 5,063,304 | 11/1991 | Iyengar | 307/296.6 |
| 5,111,433 | 5/1992 | Miyamoto | 365/201 |
| 5,119,337 | 6/1992 | Shimizu et al. | 365/201 |

*Primary Examiner*—Joseph A. Popek
*Assistant Examiner*—A. Zarabian
*Attorney, Agent, or Firm*—Alan R. Loudermilk

[57] ABSTRACT

For enabling burn-in test in a memory device such that a test mode timing signal and detected voltage level of an external power supply are combined in order to maintain compatibility with conventional timing signals, and for preventing the burn-in test circuit from dissipating power in a standby state, there is provided a sense control circuit for producing a short duration enable pulse in response to an input level of timing signals such as WCBR, CBR, or ROR, and a voltage sensor for sensing the input voltage level of the external power supply voltage during the short duration pulse. Also, the circuit includes a burn-in sensor which generates a signal output which determines set or reset of the burn-in test mode in response to the timing signals and the detected level of the voltage sensor. Since the voltage sensor is operated only when the short duration pulse is applied, the power consumption in the voltage sensor is negligible even during the sensing operation of the external supply voltage. Further, the burn-in test mode is activated in the memory device if the external input signals satisfy the particular condition and the level of the external supply voltage is higher than the preset burn-in test voltage, thereby the memory device is prevented from entering into the burn-in test mode due to noise of the external power supply voltage.

15 Claims, 4 Drawing Sheets

BURN-IN TEST CIRCUIT FOR SEMICONDUCTOR MEMORY DEVICE

FIELD OF THE INVENTION

The present invention relates to a test circuit in a semiconductor memory device for sorting early bad memory chips and, more particularly, to a burn-in test circuit for enabling burn-in test in the memory chips such that the test mode timing signal and the level of the external power supply voltage are combined in order to maintain compatibility with conventional test mode timing signals, and for preventing the test circuit from current consumption in the standby state for the burn-in test.

DESCRIPTION OF THE PRIOR ART

As is well known, the burn-in test of semiconductor memory devices such as a dynamic RAM is a testing method for operating the memory device at a higher voltage and temperature than that of the normal operating condition in order to remove weak memory device after being packaged.

A conventional burn-in test circuit of an on-chip power supply regulation system in a memory device is exemplified by U.S. Pat. No. 5,063,304, issued Nov. 5, 1991, and assigned to Texas Instrument Incorporated. There, as shown in FIG. 1, a test circuit is comprised of a voltage sensor 20 for sensing the input level of external power supply voltage (Vcc), a reference voltage generator 10 for producing the reference voltage on which sensing of external supply voltage Vcc and generation of the regulated internal supply voltage are based, an internal voltage generator 30 for supplying an accelerated voltage (Vint) which depends upon the applied power supply voltage to a memory array 50 and its peripheral circuit.

When the memory array 50 is set to the normal operation mode rather than burn-in test mode, the internal voltage generator 30 generates a constant internal voltage (Vint) which is irrespective of the input level of the external power supply voltage (Vcc) by adapting the reference voltage (Vref) from the reference voltage generator 10. Hence, the memory array 50 is operated by a constant internal supply voltage.

When the voltage of the external power supply (Vcc) is increased to a predetermined level which is higher than the voltage of burn-in test, the voltage sensor 20 detects the level of the external supply voltage and generates a signal which represents the start of burn-in test of the memory device. This burn-in signal is applied to the internal voltage generator 30, and the internal voltage generator 30 changes its operation mode from generating the above-mentioned constant internal supply voltage to generating an accelerated internal voltage which depends on the applied power supply voltage and which is sufficient for performing the burn-in test.

Thus, the semiconductor memory array 50 is set to the burn-in test operation mode.

Because the above conventional burn-in test circuit determines whether the memory device is operated at the normal mode or at the burn-in test mode by detecting the level of the external supply voltage, the voltage sensor 20 for sensing the input level of the external supply always should be operative, which results in current consumption even in the standby state.

Further, if the external power supply is applied with impulse like noise, the voltage sensor 20 will recognize it as a higher level voltage and inadvertently permit the internal voltage generator 30 to operate as in the burn-in test mode. This will lower the overall reliability of the burn-in test circuit.

SUMMARY OF THE INVENTION

The present invention overcomes these and other problems and provides a burn-in test circuit for a semiconductor memory device which comprises a reference voltage generator for generating a reference voltage; a timing generator for introducing timing signals such as WCBR, CBR and ROR signals responsive to the input status of external input signals such as /RAS, /CAS and /WE; a sense control circuit for producing a short duration pulse in response to the input status of the WCBR, CBR, or ROR signals; a voltage sensor for sensing the input level of an external power supply voltage, and for generating an output signal HVCC which represents whether the input level of the external power supply voltage is higher than a preset voltage for the burn-in test, during the short duration pulse supplied from the sense control circuit; a burn-in sensor for generating an output signal which determines the start or stop of the burn-in test mode on the basis of the input status of the timing signals WCBR, CBR, and ROR and the output signal level of the voltage sensor; and an internal voltage generator for supplying a constant internal voltage or an increasing internal voltage depending upon the applied external power supply voltage to the memory array in response to the status of the output signal of the burn-in sensor.

Preferably, the burn-in sensor generates the output signal which makes the internal voltage generator to be set to the burn-in test mode if both the /CAS and /WE signals are at a "low" level state when the /RAS signal changed its state from "high" to "low" level, and when the voltage level of the external power supply detected by the voltage sensor is higher than the preset burn-in voltage.

Further, the burn-in sensor generates an output signal which causes the internal voltage generator to reset the burn-in test mode if the /CAS signal is at a "low" level and the /WE signal at a "high" level when the /RAS signal changes its level from "high" to "low", and if the /CAS signal maintains its "high" level state when the /RAS signal changes its level from "high" to "low" and again to "high", as well as when the detected voltage level of the external power supply is lower than the preset burn-in voltage.

Other aims and advantages, as well as a more complete understanding of the present invention, will appear from the following explanation of an exemplary embodiment and the accompanying drawings thereof.

DETAILED DESCRIPTION OF THE PREFERRED EMBODIMENT

Figure 1:
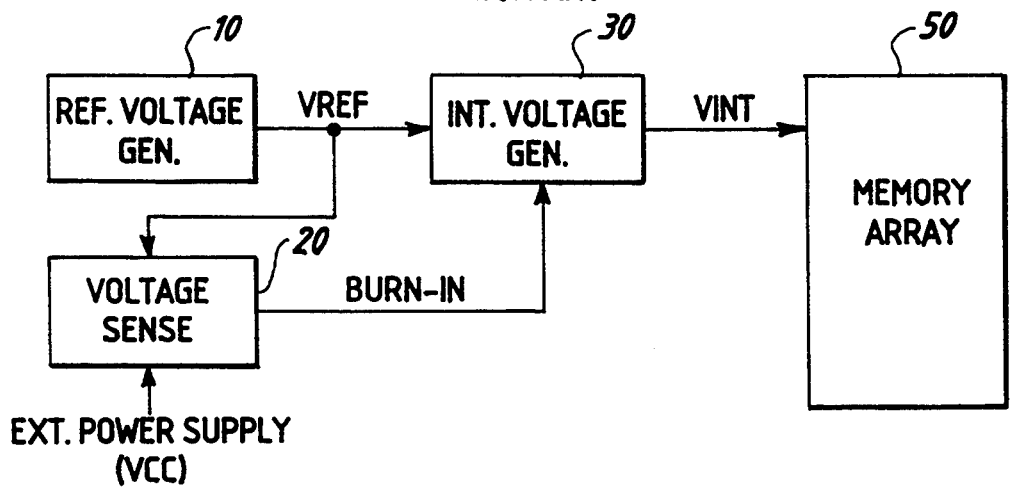
FIG. 1 is a block diagram of a conventional burn-in test circuit in the semiconductor memory device.
Figure 2:
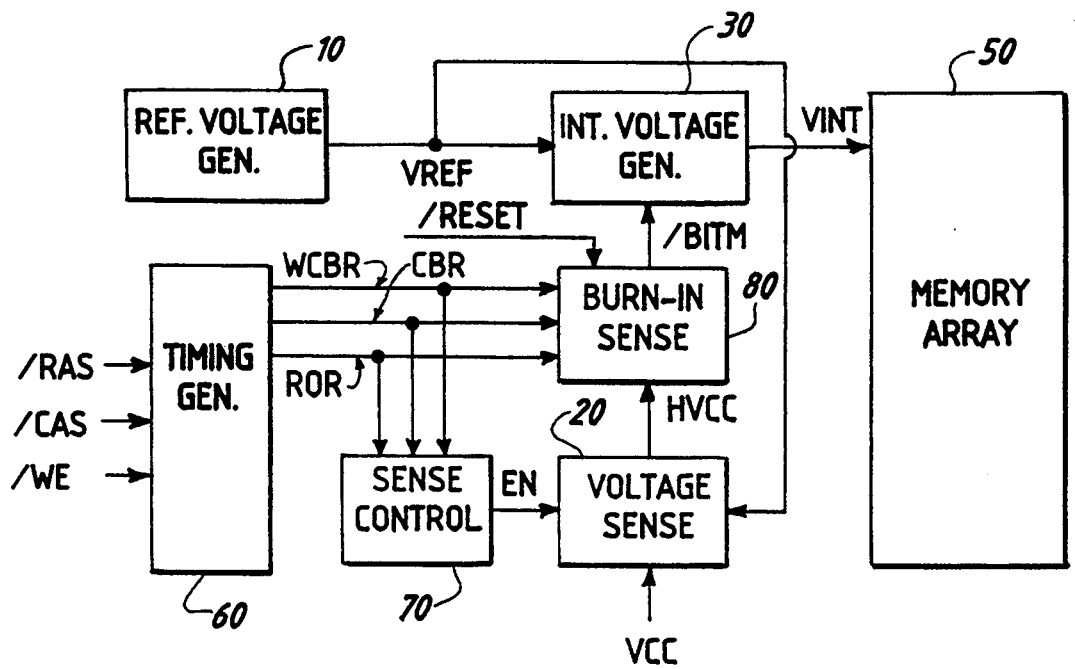
FIG. 2 is a block diagram of a burn-in test circuit configured in accordance with the present invention.

Referring to FIG. 2, a preferred embodiment of the burn-in test circuit for a semiconductor memory device according to this invention comprises a timing generator 60 which generates signals WCBR, CBR and ROR on the basis of the status of external input signals /RAS, /CAS, and /WE. The output lines which carry the WCBR, CBR, and ROR signals of the timing generator 60 are connected to a sense control circuit 70 and to a burn-in sensor 80. The output of the burn-in sensor 80 is connected to the internal voltage generator 30.

Further, the output of the sense control circuit 70 is connected to an enable input of the voltage sensor 20, and the output of the voltage sensor 20 is connected with the burn-in sensor 80.

The timing generator 60 is a part of a peripheral circuit in a semiconductor memory device such as a dynamic RAM, which combines the timing of the Row Address Strobe signal (/RAS), the Column Address Strobe signal (/CAS) and the Write Enable signal (/WE), and generates a /CAS before /RAS refresh (CBR) signal, /RAS only refresh (ROR) signal and a Write Enable CBR (WCBR) signal which makes the operation of the memory device to be set in a test mode.

The above WCBR, CBR and ROR signals are exclusive for one another; that is, only one of the three signals has a "high" level status at a given moment.

Figure 4:
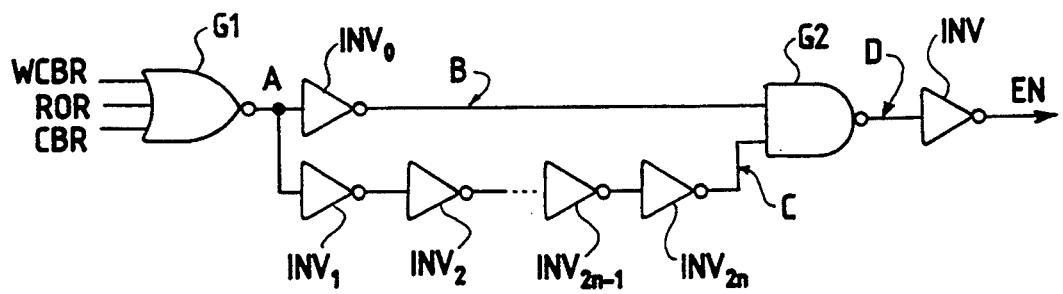
FIG. 4 is a detailed circuit diagram of sense control circuit 70 shown in FIG. 2.

As shown in detail in FIG. 4, the sense control circuit 70 is comprised of a NOR gate G1 for receiving WCBR, CBR and ROR signals from the timing generator 60, an inverter INV0 connected to the output of NOR gate G1, a chain of inverter INV1–INV2n which are even numbered and parallelly coupled to the inverter INV0, a NAND gate G2 connected to the outputs of the respective inverters INV0 and INV2n, and an inverter INV connected to the output of the gate G2.

When a "high" level of WCBR, CBR or ROR signal is applied to an input of the NOR gate G1, the output signal of gate G1 changes its state to a "low" level. This "low" level signal is directed to the inverters INV0 and INV1–INV2n to make a short duration pulse of a "low" level at the output of NAND gate G2 due to the difference of the time delay between inverter INV0 and INV-1–INV2n. This low level short pulse appears at the output of inverter INV as a "high" level pulse (EN) which will be applied to the voltage sensor 20 in FIG. 2.

Figure 5:
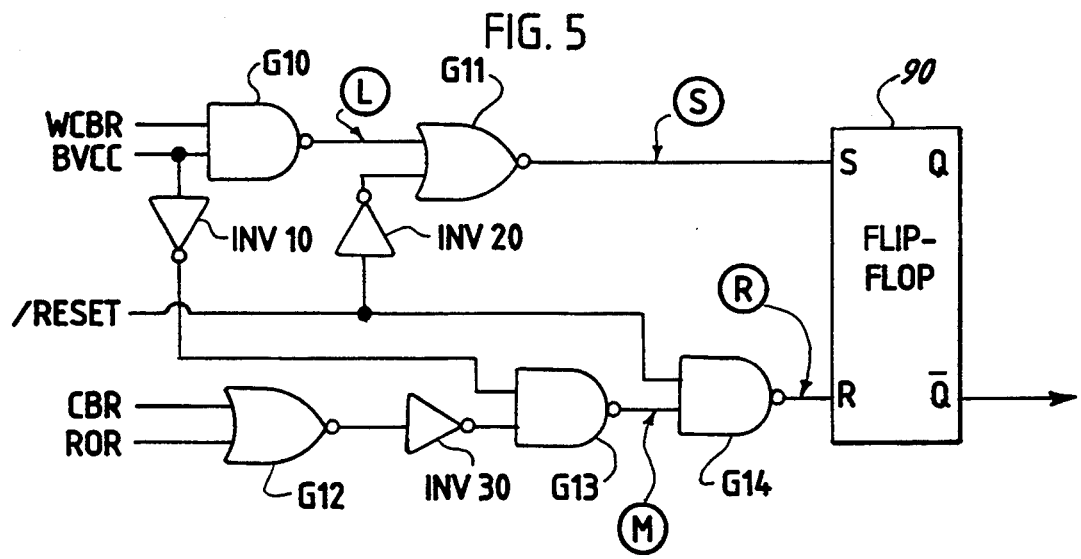
FIG. 5 is a detailed circuit diagram of burn-in sensor 80 in FIG. 2.

Also, the detailed circuit configuration of the burn-in sensor 80 in FIG. 2 is disclosed in FIG. 5, in which timing signals WCBR, CBR and ROR from the timing generator 60 as well as output signal HVCC of the voltage sensor 20 are combined to generate a burn-in test mode signal. There, the inputs of NAND gate G10 are applied with the WCBR and the HVCC signals, and the inputs of NOR gate G12 are applied with the CBR and ROR signals. The output of the gate G10 is directed to one input of NOR gate G11 and the other input thereof is connected with the /RESET input terminal through an inverter INV20, in order to make the output signal of the burn-in sensor 80 to be at "high" level status when the memory device is powered-up, i.e., initially operated by the power supply voltage.

Further, the output of NOR gate G11 is directed to the "set" input of a Flip-Flop 90, and the output of the gate G12 is connected with one input of NAND gate G13 through an inverter INV30 and the other input thereof is connected with input of HVCC signal through an inverter INV10. Again, the output of the gate G13 is connected with one input of NAND gate G14, for combining with the /RESET signal, and the output thereof is directed to the "reset" input of the Flip-Flop 90. At the output /Q of the Flip-Flop 90 the burn-in test mode signal (/BITM) is generated.

As similar in the prior art circuit, the internal voltage generator 30 is configured such that a reference voltage Vref from the reference voltage generator 10 and the burn-in test mode signal output from the burn-in sensor 80 are applied to generate internal voltage Vint to be supplied to the memory array 50.

Figure 3:
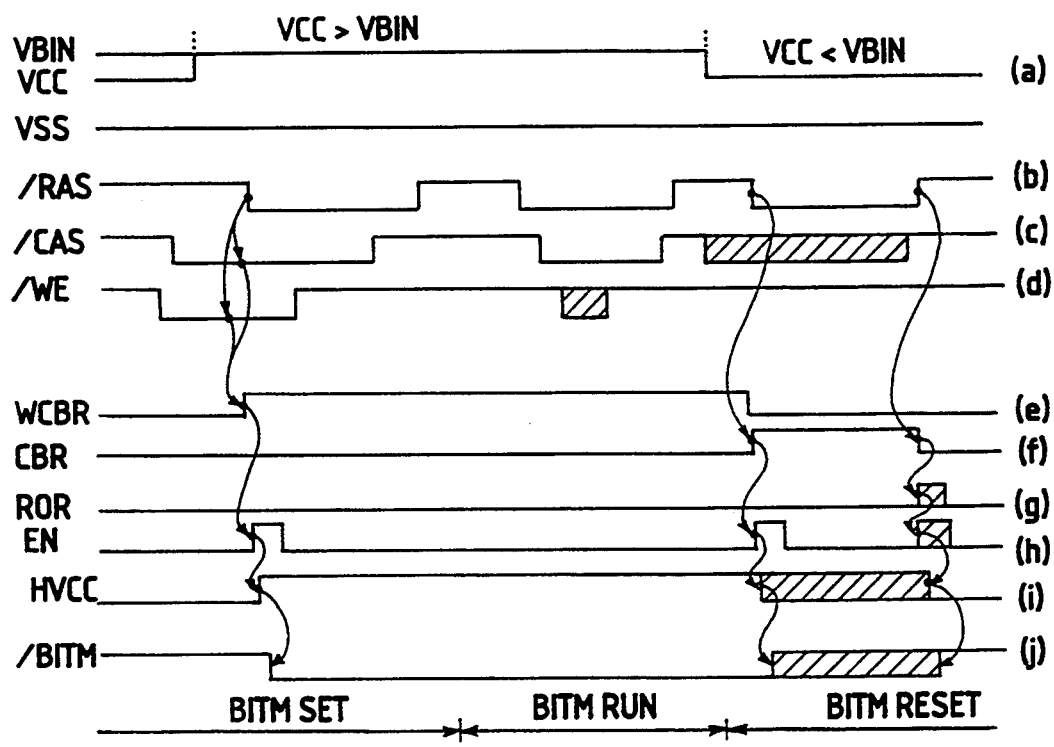
FIG. 3 is a timing chart useful for explaining the operation of a burn-in test circuit in accordance with the present invention.

The operation and effect of the burn-in test circuit of the present invention will be apparent from the following description with reference to the timing chart of FIG. 3.

Test mode timing signal WCBR is generated in the timing generator 60, if the /CAS signal and the /WE signal are in a "low" level state when the /RAS signal has changed its state from "high" to "low" level. As shown in FIG. 3(e), the waveform of the WCBR signal has a "high" level state under the above-mentioned external input signal status (a so-called "WCBR condition"). When the "high" level WCBR signal is applied to the sense control circuit 70, the enable pulse (EN) which has a "high" level and a short time duration (see FIG. 3h) is generated. This enable pulse activates the voltage sensor 20 to be operative during the time interval of the enable pulse. Thereby, the voltage sensor 20 detects the input level of the external power supply Vcc during the time when the enable pulse (EN) has "high" level state.

If the voltage of external power supply Vcc detected by the voltage sensor 20 is higher than the voltage used to set for the burn-in test Vbin, the "high" level output signal HVCC is produced and latched by the voltage sensor 20. At this time, the burn-in sensor 80 determines the operation mode of the memory device on the basis of the level of the received WCBR signal and latched output signal HVCC.

Thus, if the output signal HVCC of voltage sensor 20 is in a "high" level state (Vcc>Vbin) and the WCBR signal has a "high" level, the burn-in sensor 80 produces a "low" level burn-in test mode signal (/BITM; see FIG. 3j) which allows the memory device to enter into the burn-in test mode.

Figure 7:
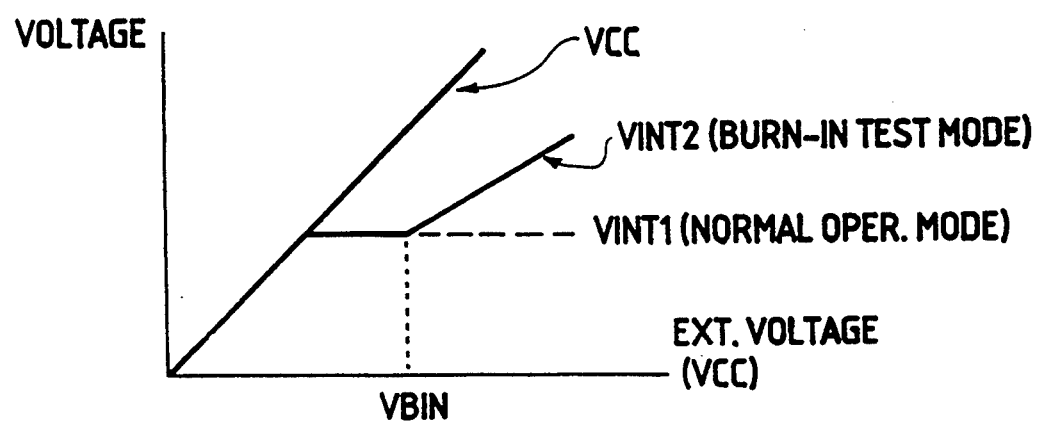
FIG. 7 is a graphic representation of a typical change of the the internal supply voltage in relation to external power supply voltage.

When the burn-in sensor 80 is set to the burn-in test mode, latched /BITM signal by the burn-in sensor 80 is applied to the internal voltage generator 30. At this time, the internal voltage generator 30 changes its operation mode, as shown in FIG. 7, from generating a constant internal voltage Vint1 irrespective of an increase of the external supply voltage to generating an increasing internal voltage Vint2 proportional to the increase of the external power supply voltage.

Yet, if the status of the input signals /RAS, /CAS and /WE are under the WCBR condition, and the voltage of external power supply Vcc detected by the voltage sensor 20 is lower than the voltage set for the burn-in test Vbin, the output signal HVCC of the voltage sensor 20 maintains its initial "low" state, and the output signal /BITM of the burn-in sensor 80 also maintains its "high" level state. This permits the burn-in test circuit to operate in normal parallel test mode and the internal voltage generator 30 to maintain and to supply a constant internal voltage, such as not in the burn-in test mode.

At this time, although the voltage of external power supply Vcc is increased over the preset voltage for the burn-in test Vbin, if the status of external input signals are not in the aforementioned WCBR condition, the voltage sensor 20 is not applied with the enable pulse EN and the output signal HVCC thereof will maintain its "low" level state. Also, since the burn-in sensor 80 maintains its output signal /BITM at a "high" level state, the internal voltage generator 30 will maintain a constant internal voltage at the output thereof.

With this, the memory device is prevented from entering into the Burn-In test mode due to noise of the external power supply voltage.

Meanwhile, when the operation of the burn-in test circuit of the present invention is set to the burn-in test mode, which satisfies the above-mentioned WCBR condition and the required external power supply voltage which is higher than the preset burn-in voltage, the subsequent memory access of the memory device will be continued in the burn-in test mode, otherwise the particular condition which will be set forth hereinafter is satisfied.

That is, the change of operation from the burn-in test mode to the normal mode will be performed at CBR refresh or ROR refresh timing and at a lower external power supply voltage which is below the preset Burn-In voltage (Vbin). At this moment, the timing generator 60 generates the CBR output signal (see FIG. 3f) if the /CAS input signal is in a "low" level state and the /WE signal is in "high" level state, when the /RAS signal has changed its state from "high" level to "low" a (so-called "CBR condition").

Also, the ROR output signal is generated (see FIG. 3g) if the /CAS signal maintains its "high" level state when the /RAS signal changes its state from "high" level to "low" level and again to "high" level a (so-called "ROR condition").

When the above-mentioned CBR signal or ROR signal is received by the sense control circuit 70, it produces a short duration enable pulse (EN) in by the same manner as when the WCBR signal is applied to the sense control circuit 70. Thus, the voltage sensor 20 activated by the enable pulse detects the voltage level of the external power supply Vcc during the short time interval, and if the Vcc voltage level is higher than Vbin, the output signal HVCC of the voltage sensor 20 maintains its "high" level state. Also, maintained is the latched "low" level output signal /BITM of the burn-in sensor 80. Therefore, the memory device will operate continuously in the burn-in test mode, and at this operation mode, the CBR refresh or ROR refresh is performed.

However, if the detected voltage level of the external power supply is lower than the preset burn-in voltage (Vcc<Vbin) under the above-mentioned CBR condition or ROR condition, the output signal /BITM of the burn-in sensor 80 will change its state from "low" level to "high" level, and the internal voltage generator 30 which received the "high" level /BITM signal allows the memory device to be reset to the normal operation mode which generates a constant internal voltage irrespective of an increase of the external power supply voltage.

Thus, the burn-in test operation of the internal voltage generator 30 that generated an increased internal voltage proportional to the increase of the external supply voltage is stopped.

The signal producing process of the /BITM signal in the burn-in sensor 80, which determines set and reset of the burn-in test mode, will be described in detail with reference to the timing chart of FIG. 6.

It is provided that the timing signals WCBR, CBR, ROR as well as the output signal HVCC be applied to the gates G10 and G12 in FIG. 5, with the same signal status shown in FIG. 3.

In the course of setting the burn-in test mode, the WCBR input has a "high" level state, and also the HVCC input has a "high" level. Thus, the output (L) of the NAND gate G10 will be at a "low" level. At this time, because the CBR and the ROR signals which is applied with two inputs of the NOR gate G12 have a "low" level state, the output of the gate G12 will be at a "high" level, and through an inverter INV30 again to a "low" level. This "low" level signal is applied to the inputs of NAND gate G13 together with the HVCC output signal which is changed to "low" level state through an inverter INV10, to make a "high" level signal at the output (M) thereof.

This "high" level signal is applied to the inputs of the NAND gate G14 together with the "high" level /RESET signal, to make a "low" level reset signal at the output (R) of the gate G14.

The reset signal R is applied to the reset input of the Flip-Flop 90, and hence at the output Q and /Q of the Flip-Flop 90, "high" and "low" level state signal are produced, respectively. The "low" level /Q output signal will constitute the burn-in test mode signal /BITM and applied to the internal voltage generator 30.

The "low" level state /BITM signal will change its state to a "high" level in the course of resetting the burn-in test mode, in response to the "high" level CBR or ROR timing signals. At the CBR timing, the CBR and the ROR signals received by the gate G12 have a "high" and "low" level state, respectively, and at the ROR timing, the CBR and the ROR signals have a "low" and "high" level state.

Figure 6:
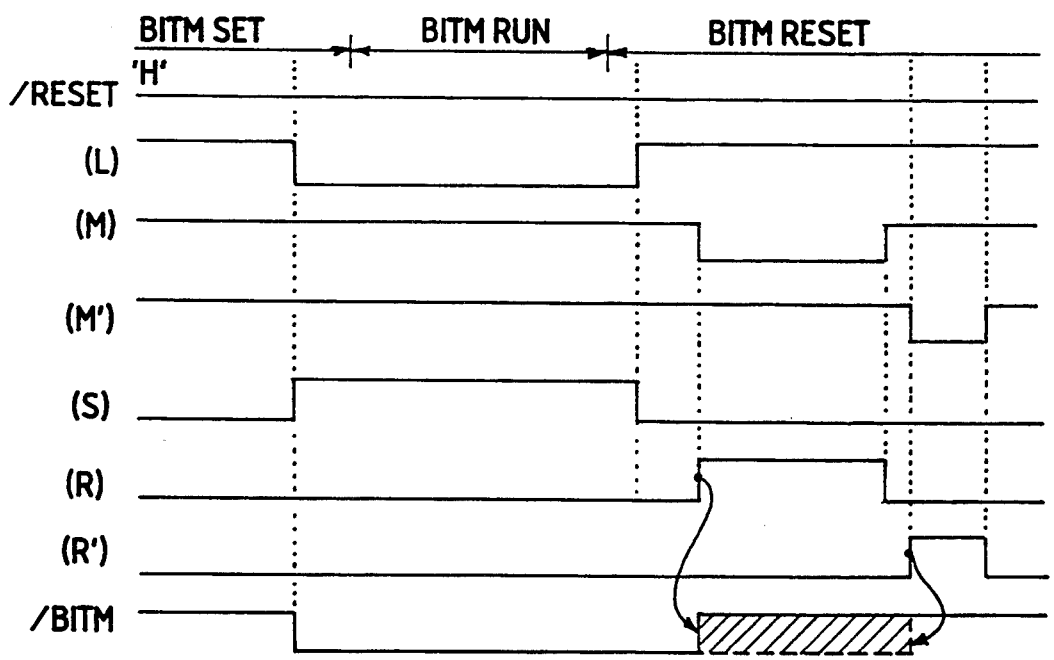
FIG. 6 illustrates waveforms derived from each part of the circuit of FIG. 5.

Therefore, the waveforms M and R in FIG. 6 represent the signal responses in the CBR timing, at the outputs of gates G13 and G14 in FIG. 5, respectively. Similarly, the waveforms M' and R' in FIG. 6 are responsive to the ROR timing signal.

As shown in FIG. 7, a functional graph represents typical change of the internal voltage when the internal voltage generator 30 is set to the normal operation mode and to the burn-in test mode. Again, there is shown an increasing internal voltage Vint2 which is proportional to the external supply voltage Vcc when the status of the external input signals are under a WCBR condition and the external power supply voltage Vcc becomes higher than the preset burn-in voltage Vbin, and a constant internal voltage Vint1 which is irrespective of an increase of the external power supply voltage when the status of external input signals are under a CBR or ROR condition and the external voltage Vcc is lower than the preset burn-in voltage Vbin.

As apparent from the foregoing, the voltage sense control in the present invention provides that the voltage sensor be operative only when the short duration enable pulse is supplied, therefore the power consumption in the voltage sensor is negligible even at the sensing operation of the external power supply voltage.

Further, because the burn-in test mode is activated in the memory device if external input signals satisfy the particular condition and the voltage of the external power supply become higher than the preset voltage for the burn-in test, the memory device is prevented from entering into the burn-in test mode due to noise of the external power supply voltage.

What is claimed is:

1. A burn-in test circuit for a semiconductor memory device comprising:

a reference voltage generator for generating a reference voltage;

a timing generator for generating timing signals responsive to external input signals;

a sense control circuit for producing a short duration pulse in response to the timing signals;

a voltage sensor for sensing the input voltage level of an external power supply voltage, and for generating an output signal responsive to whether the input voltage level of the external power supply voltage is higher than a preset voltage level during the time when the short duration pulse is supplied from the sense control circuit;

a burn-in sensor for generating an output signal which determines start or stop of a burn-in test mode on the basis of the timing signals and the output signal of the voltage sensor; and an internal voltage generator for supplying a constant internal voltage based on the reference voltage or an increasing internal voltage derived from the external power supply voltage to a memory array of the memory device in response to the output signal of the burn-in sensor.

2. A burn-in test circuit according to claim 1, wherein the external signals include a column address strobe signal, a row address strobe signal and a write enable signal each having an active and inactive state, wherein the burn-in sensor generates the output signal which determines start of the burn-in test mode if the column address strobe signal and the write enable signal are in the active state when the row address strobe signal changes its state from inactive to active at a time when the voltage level of the external power supply detected by the voltage sensor is higher than the preset voltage level.

3. A burn-in test circuit according to claim 1, wherein the external signals include a column address strobe signal, a row address strobe signal and a write enable signal each having an active and inactive state, wherein the burn-in sensor generates the output signal which determines stop of the burn-in test mode if the column address strobe signal is in the active state and the write enable signal is in the inactive state when the row address strobe signal changes its state from inactive to active, or if the column address strobe signal maintains an inactive state when the row address strobe signal changes its state from inactive to active and again to inactive, at a time when the detected voltage level of the external power supply is lower than the preset voltage level.

4. A burn-in test circuit according to claim 1, wherein the sense control circuit comprises a NOR gate for receiving timing signals from the timing generator, a first inverter connected to the output of the NOR gate, an even numbered chain of inverters parallelly coupled to the first inverter, a NAND gate with inputs connected to the outputs of the first inverter and the last of the chain of inverters, and second inverter connected to the output of the NAND gate.

5. A burn-in test circuit according to claim 1, wherein the burn-in sensor comprises a first NAND gate receiving as inputs a first timing signal generated by the timing generator and the output signal generated by the voltage sensor, a first NOR gate receiving as inputs second and third timing signals generated by the timing generator, a second NOR gate receiving as an input the output of the first NAND gate and receiving as another input a reset signal coupled to a reset input terminal through a second inverter, a Flip-Flop having set and reset inputs and an output, wherein the output of the second NOR gate is coupled to the set input of the Flip-Flop, a second NAND gate receiving as an input the output of the first NOR gate through a second inverter and as another input thereof the output signal generated by the voltage sensor through a third inverter, wherein the output of the second NAND gate is connected to one input of a third NAND gate G14 and a second input of the third NAND gate is coupled to receive the reset signal, wherein the output of the third NAND gate is coupled to a reset input of the Flip-Flop, and wherein at the output of the Flip-Flop the output signal of the burn-in sensor is generated.

6. A test mode control circuit for a semiconductor device such as a memory device operative in a normal mode and a burn-in test mode, comprising:

a timing generator for generating one or more timing signals in response to one or more external input signals to the semiconductor device;

a sense control circuit for producing a short duration pulse signal in response to one or more of the timing signals generated by the timing generator;

a voltage sensor for sensing a voltage level supplied to the semiconductor device by an external power supply, wherein the voltage sensor generates a first output signal if the sensed voltage level exceeds a predetermined voltage level only during the short duration pulse signal generated by the sense control circuit;

a burn-in sensor for generating a burn-in mode test signal responsive to one or more of the timing signals and the first output signal of the voltage sensor, wherein the semiconductor device operates in the burn-in test mode responsive to the burn-in mode test signal.

7. The apparatus of claim 6, wherein the voltage sensor generates a second output signal if the sensed voltage level does not exceed the predetermined voltage level during the short duration pulse signal generated by the sense control circuit, wherein the burn-in sensor does not generate a burn-in mode test signal responsive to one or more of the timing signals and the second output signal of the voltage sensor, wherein the semiconductor device operates in the normal mode.

8. The apparatus of claim 6, wherein the external signals include a column address strobe signal, a row address strobe signal and a write enable signal each having an active and inactive state, wherein the burn-in sensor generates the burn-in test mode signal if the column address strobe signal and the write enable signal are in the active state when the row address strobe signal changes its state from inactive to active at a time when the voltage level of the external power supply detected by the voltage sensor exceeds the predetermined voltage level.

9. The apparatus of claim 7, wherein the external signals include a column address strobe signal, a row address strobe signal and a write enable signal each having an active and inactive state, wherein the burn-in sensor generates a normal mode signal if the column address strobe signal is in the active state and the write enable signal is in the inactive state when the row address strobe signal changes its state from inactive to active, or if the column address strobe signal maintains an inactive state when the row address strobe signal changes its state from inactive to active and again to inactive, at a time when the detected voltage level of the external power supply does not exceed the predetermined voltage level.

10. The apparatus of claim 8, wherein the burn-in sensor generates a normal mode signal if the column address strobe signal is in the active state and the write enable signal is in the inactive state when the row address strobe signal changes its state from inactive to active, or if the column address strobe signal maintains an inactive state when the row address strobe signal changes its state from inactive to active and again to inactive, at a time when the detected voltage level of the external power supply does not exceed the predetermined voltage level, wherein the semiconductor device operates in the normal mode responsive to the normal mode signal.

11. In a semiconductor device such as a memory device, a method for activating a burn-in test mode of the semiconductor device comprising:
generating one or more timing signals responsive to one or more external input signals to the semiconductor device;
generating a short duration pulse signal responsive to one or more of the timing signals;
sensing an input voltage supplied to the semiconductor device and generating a first signal if the sensed input voltage exceeds a predetermined threshold voltage only during the short duration pulse signal;
generating a burn-in test mode signal responsive to the first signal, wherein the burn-in test mode signal activates the burn-in test mode of the semiconductor device.

12. The method of claim 11, wherein a second signal is generated if the sensed input voltage does not exceed a predetermined threshold voltage during the short duration pulse signal, wherein the semiconductor device operates in a normal mode responsive to the second signal.

13. The method of claim 11, wherein the external signals include a column address strobe signal, a row address strobe signal and a write enable signal each having an active and inactive state, wherein the burn-in test mode signal is generated if the column address strobe signal and the write enable signal are in the active state when the row address strobe signal changes its state from inactive to active at a time when the voltage level of the input voltage exceeds the predetermined voltage level.

14. The method of claim 12, wherein the external signals include a column address strobe signal, a row address strobe signal and a write enable signal each having an active and inactive state, wherein a normal mode signal is generated if the column address strobe signal is in the active state and the write enable signal is in the inactive state when the row address strobe signal changes its state from inactive to active, or if the column address strobe signal maintains an inactive state when the row address strobe signal changes its state from inactive to active and again to inactive, at a time when the voltage level of the input voltage does not exceed the predetermined voltage level, wherein the semiconductor device operates in the normal mode responsive to the normal mode signal.

15. The method of claim 13, wherein a normal mode signal is generated if the column address strobe signal is in the active state and the write enable signal is in the inactive state when the row address strobe signal changes its state from inactive to active, or if the column address strobe signal maintains an inactive state when the row address strobe signal changes its state from inactive to active and again to inactive, at a time when the voltage level of the input voltage does not exceed the predetermined voltage level, wherein the semiconductor device operates in a normal mode responsive to the normal mode signal.

* * * * *